United States Patent
Ohta (12) United States Patent
(10) Patent No.: US 7,765,448 B2
(45) Date of Patent: Jul. 27, 2010

(54) CLOCK SIGNAL DISTRIBUTING CIRCUIT, INFORMATION PROCESSING DEVICE AND CLOCK SIGNAL DISTRIBUTING METHOD

(75) Inventor: Hidenobu Ohta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 329 days.

(21) Appl. No.: 12/031,116

(22) Filed: Feb. 14, 2008

(65) Prior Publication Data
US 2008/0197873 A1 Aug. 21, 2008

(30) Foreign Application Priority Data
Feb. 15, 2007 (JP) ............................. 2007-035027

(51) Int. Cl.
*G01R 31/28* (2006.01)
(52) U.S. Cl. ..................................................... 714/731
(58) Field of Classification Search ................. 714/731, 714/744
See application file for complete search history.

(56) References Cited

U.S. PATENT DOCUMENTS

| | | | | |
|---|---|---|---|---|
| 4,800,564 A | * | 1/1989 | DeFazio et al. | 714/814 |
| 5,864,564 A | * | 1/1999 | Levitt et al. | 714/731 |
| 6,037,820 A | * | 3/2000 | Ishizaka | 327/292 |
| 6,538,957 B2 | * | 3/2003 | Magoshi | 365/233.1 |
| 6,630,851 B2 | * | 10/2003 | Masleid | 327/165 |
| 7,079,973 B2 | * | 7/2006 | Rodgers et al. | 702/117 |
| 7,102,402 B2 | * | 9/2006 | Kurd et al. | 327/158 |
| 7,102,406 B2 | * | 9/2006 | Ishihara | 327/200 |
| 7,366,966 B2 | * | 4/2008 | LeBerge | 714/718 |
| 7,447,961 B2 | * | 11/2008 | Tan | 714/726 |
| 7,613,971 B2 | * | 11/2009 | Asaka | 714/731 |

FOREIGN PATENT DOCUMENTS

| | | |
|---|---|---|
| JP | 09-063292 | 3/1997 |
| JP | 2006-186660 | 7/2006 |

* cited by examiner

*Primary Examiner*—James C Kerveros
(74) *Attorney, Agent, or Firm*—Staas & Halsey LLP (57) ABSTRACT

An integrated circuit includes a test pattern input unit for inputting a test pattern into cells, a clock distributing unit for distributing a clock signal to the cells, a first cell that receives the clock signal distributed by the clock distributing unit, a second cell that receives the clock signal after the clock signal is received by the first cell, a data transfer unit for transferring a data signal from the first cell to the second cell, a clock transfer unit for distributing the clock signal to the first cell and the second cell and transferring the clock signal in the same direction as the transfer direction of the data signal, and a failure detecting unit for inputting the test pattern into the cells and detecting failures of the cells on the basis of the results of the test pattern output from the cells.

5 Claims, 8 Drawing Sheets

FIG.7

US 7,765,448 B2

CLOCK SIGNAL DISTRIBUTING CIRCUIT, INFORMATION PROCESSING DEVICE AND CLOCK SIGNAL DISTRIBUTING METHOD

CROSS-REFERENCE TO RELATED APPLICATIONS

This application is related to and claims priority to Japanese patent application No. 2007-35027 filed on Feb. 15, 2007, in the Japan Patent Office, the entire contents of which are incorporated by reference herein.

BACKGROUND

1. Field of the Invention

The present invention relates to a clock signal distributing circuit for distributing a clock signal to cells in test device, each of the cells having a clock terminal. The present invention also relates to a method for detecting manufacturing defects in a semiconductor integrated circuit in which many cells are disposed on a chip. The present invention relates particularly to a clock tree construction for distributing a clock signal to a semiconductor integrated circuit, such as a large-scale integrated (LSI) circuit or the like.

2. Description of the Related Art

The number of test patterns used in semiconductor integrated circuits such as LSI circuits, etc., has increased voluminously along with recent increases in the number of memories mounted and recent promotion of large-scale design of the memories themselves. The test time of each memory has also increased, and the cost of the tests has risen.

For example, manufacturing defects of semiconductor integrated circuits such as LSI circuit, etc. are detected by applying a proper signal value to an input pin with a tester, and comparing a signal value appearing at the output pin thereof with an expected result.

The combination of the signal value applied to the input pin and the expected value appearing at the output pin is called a test pattern.

A defect occurring in an LSI circuit due to a manufacturing defect of the LSI circuit is called a failure. Many test patterns are required to test all the failures which are anticipated to occur in an LSI circuit.

Therefore, a test method called a built-in self test (BIST) is frequently used for testing memories containing random access memories (RAM), etc., by generating test patterns in the LSI circuit chip.

In BIST, a pattern generated in a pseudorandom pattern generator is applied to an internal circuit of an LSI circuit, and an output result from the internal circuit is verified and stored by an output verifier. In BIST as described above, the pseudorandom pattern generator is mounted in the LSI circuit, and thus an extremely large number of test data can be generated in a short time.

With respect to the semiconductor integrated circuit, for example, an LSI circuit, the overall LSI circuit is generally operated in synchronism with one clock signal or plural clock signals different in phase. In such a case, a clock signal supplied from an external clock is distributed to the blocks of respective parts in the LSI circuit, whereby read/write operations of a decoder and a memory, various kinds of operations, etc. are performed. However, when the wire length from the clock distributing source to each supply destination is varied, a time lag (clock skew) occurs in the arriving timing of the clock signal.

When clock skew occurs, there is a risk that circuits may malfunction because an erroneous signal is input to each block or undesired beard-like pulses occur at the output of the logic gate. Accordingly, the magnitude of the clock skew becomes a factor for determining the performance (operating speed) of the LSI circuit.

Figure 6:
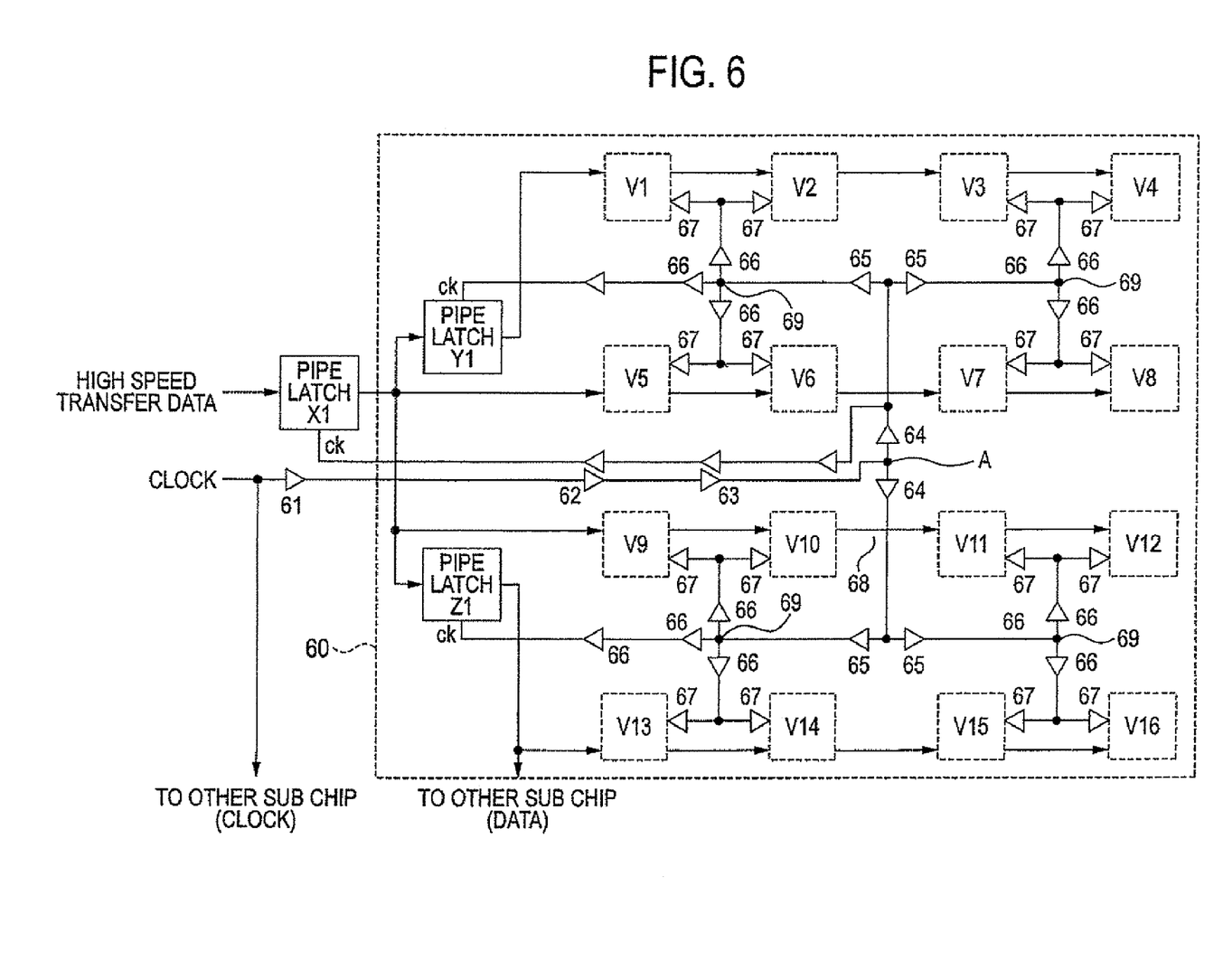
FIG. 6 is a diagram showing the construction of an H-tree type clock distributing circuit.

An H-tree type clock distributing circuit has been hitherto used for semiconductor integrated circuits such as LSI circuits, etc. This conventional H-tree type clock distributing circuit is shown a first example of the conventional a LSI circuit in FIG. 6. In FIG. 6, blocks V1 to V16 of plural stages (four stages in FIG. 6) are provided on a chip 60 (in this specification, the chip is defined as each of plural areas into which the LSI circuit is divided). Buffers 61 to 67 are connected to the respective blocks V1 to V16 like a tree by H type clock wires 68 and 69.

More specifically, a clock signal supplied from the external clock to the buffer 61 is successively distributed to the buffers 62, 63, etc. A place which is located on the clock wire between the buffer 63 and each buffer 64 and at the center of the chip 60 is set as an A point. The clock signal supplied to the place A is input to the four buffers 66 through the buffers 64, 65 on the clock wire 68 by the H-type clock wire 68 having the place A at the center thereof. These buffers 66 are respectively located at the four tip positions of the H-type clock wire 68, and the wire lengths from the place A to the four buffers 66 are set to be equal to one another. The group in buffer 66 in each point of H tree is considered to be one buffer with four buffers 66 here.

The output of each buffer 66 is further input to four buffers 67 by the H-type clock wire 69 with the buffer(s) 66 located at the center thereof. These buffers 67 are respectively located at the four tip positions of the H-type clock wire 69, and the wire lengths from the buffer(s) 66 to the four buffers 67 are set to be equal to one another.

By connecting the buffers 64 to 67 through the clock wires 68 and 69 as described above, the clock signal is distributed to the sixteen buffers 67 which are arranged in uniform density within a cell arrangement area of the chip 60. The clock signal distributed to the buffers 67 are supplied from the buffers 67 to the respective blocks V1 to V16. At this time, the wire lengths from the place A to the buffers 67 are equal to one another, and the clock skew at each buffer 67 can be made uniform among the respective buffers 67.

Figure 7:
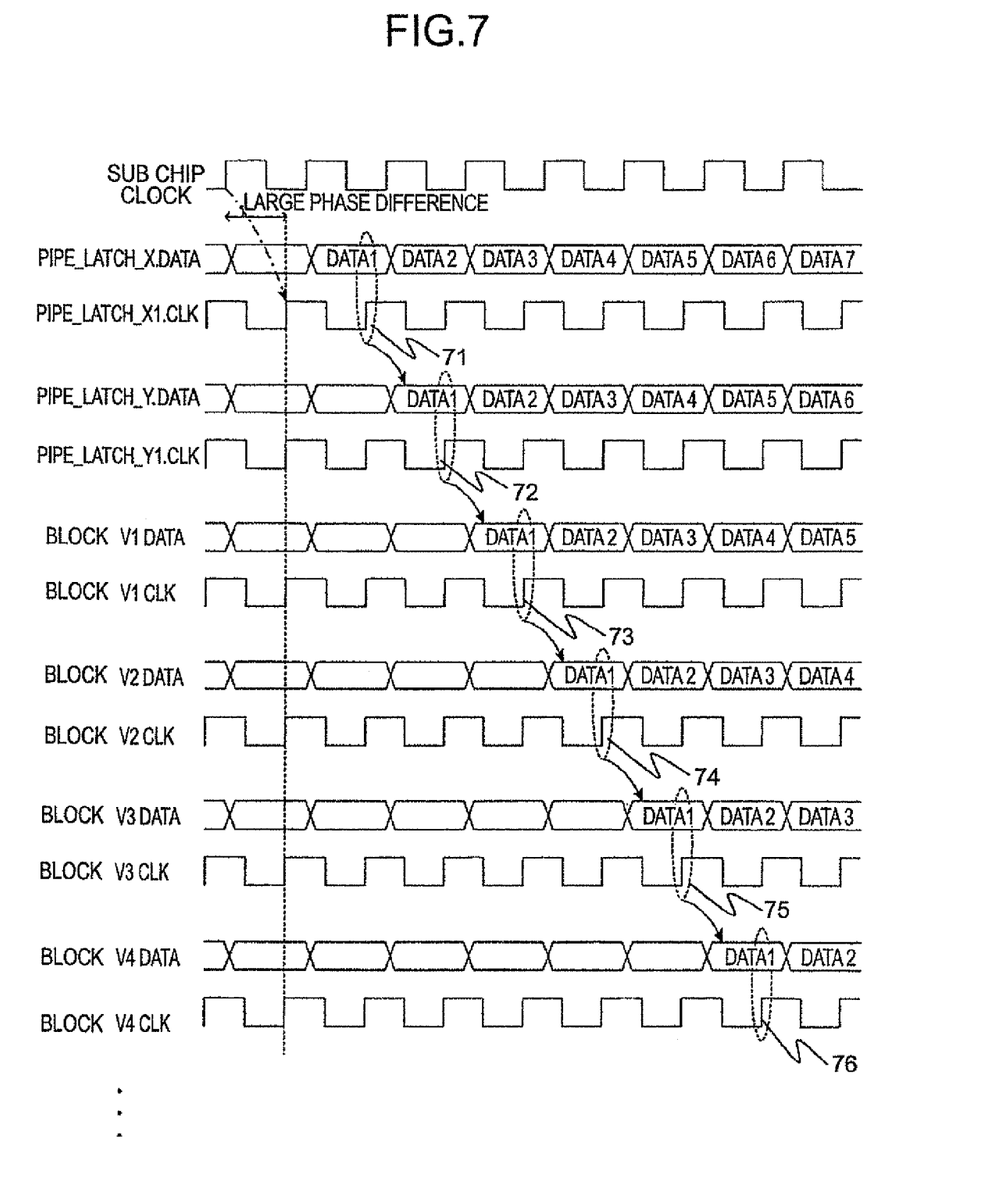
FIG. 7 is a delay chart of a conventional clock distributing circuit.

FIG. 7 is a delay chart showing the relationship between the clock and the input data when clock signals having the same phase are supplied to the respective blocks. Here, the clock signal is supplied and the data holding operation is carried out on the basis of the clock signal concerned. As shown in FIG. 6, the clock signal is distributed through the buffers 61 to 67 at the plural stages. As is apparent from FIG. 7, the clock phases 71, 72 of pipe latches (Pipe_Latch) X1, Y1 and the clock phases 73, 74, 75, 76, etc. of the respective blocks V1 to V16 flow in conformity with the data 1.

However, the large-scale design and the high integration have progressed in present LSI circuits, and it is the present situation that the number of order circuits as distribution destinations of the clock signal increases greatly.

Therefore, it has been difficult to create a clock tree having a small clock skew in connection with the increase of the number of the order circuits when the conventional H-tree type clock distributing circuit as shown in FIG. 6 was used.

Figure 8:
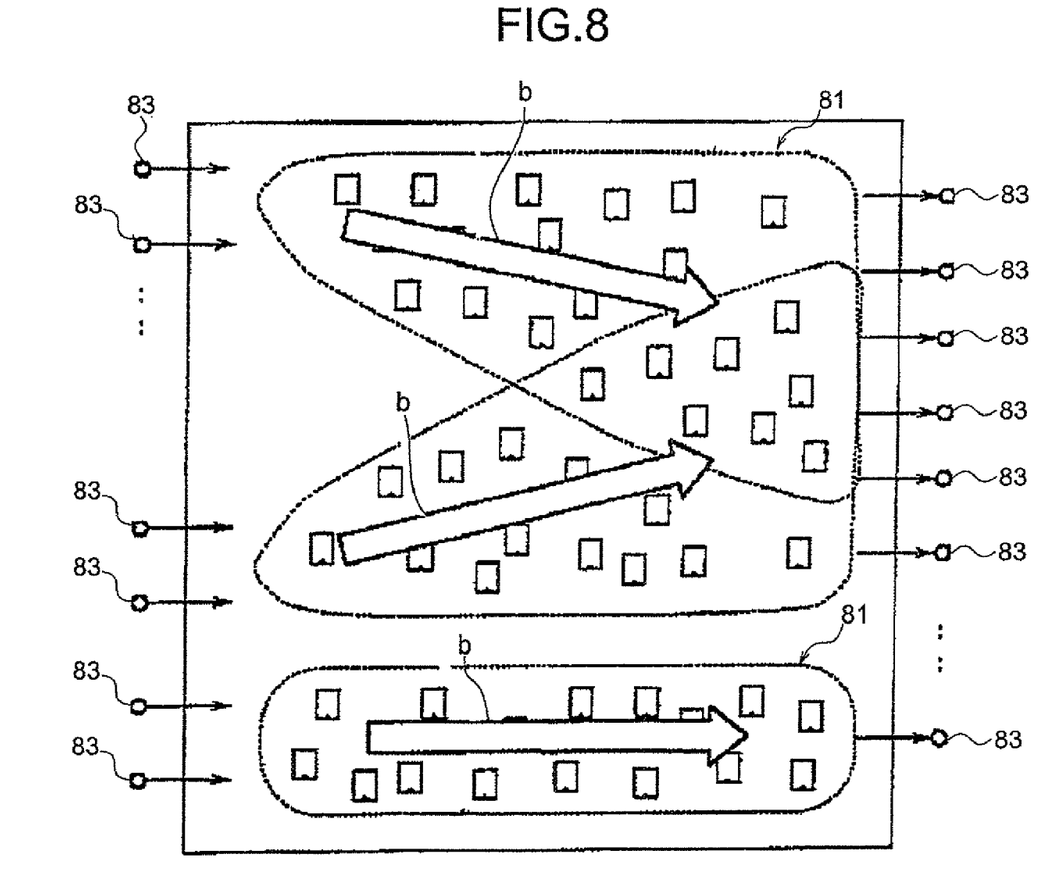
FIG. 8 is a connection diagram of the layout of a conventional LSI chip.

Therefore, a conventional technique of facilitating the design and production of an LSI circuit as described above, while reducing the clock skew is shown a second example of the conventional LSI circuit in FIG. 8.

In the second example of the conventional LSI circuit, it is important to take whether a register is upstream or downstream of the data flow, as well as the data flow to which a specific register belongs, into consideration during construction of every data flow on LSI 80, for clock trees which are independent of one another to some degree.

This invention relates to an estimating LSI circuit containing a BIST circuit for high-speed test. Accordingly, before an LSI circuit is manufactured, an estimating LSI circuit is created for checking the function/performance of circuits to be mounted in the LSI circuit and for washing out problems.

However, general LSI 80 is an assembly of independent functional blocks, as in the case of the related art as described above, so that it has a plurality of data flow parts as indicated by arrows b of FIG. 8. In the related art, the data flow parts which are different from one another have no relation to one another. Therefore, data are not arranged so as to be collected at one place, but arranged so as to be separated from one another every data flow.

Accordingly, according to the above related art, an independent tree is constructed for every data flow, so that plural types of clock trees are constructed and thus the number of the clock design operations is increased. Therefore, this related art has a problem that it is difficult to construct a proper clock tree used for the logic circuit of an LSI circuit in a short time.

On the other hand, this invention prevents plural data flow parts by adopting BIST. That is, according to this technique, a test pattern flowing in only one direction is input into the estimating LSI.

Accordingly, the design of the clock distributing circuit of this invention makes it easier to construct a clock tree as compared with the related art.

It is important to optimize the clock skew more surely while a clock distributing circuit is designed. Therefore, it is preferable to adjust the insertion and arrangement state of buffers and the number of stages of blocks together with the wiring stage at the lay-out design time.

Furthermore, it is generally desired that a clock tree is created in consideration of the balance of a clock net while viewing a block located at a predetermined position in order to optimize a clock propagation delay time. Here, the clock propagation delay time is a time required for a clock signal from one block to reach each block, and the optimization of the clock propagation delay time is to minimize (make shortest) the delay time.

In FIG. 6 is shown the symmetrical block arrangement of 4×4 blocks of a related art. However, the symmetry of the block arrangement may be actually lost due to restriction of floor plan or the like as in the case of 5×3 blocks, for example. Accordingly, it has been more and more difficult to construct an optimum H-tree type clock wire. As a result, the structure of the H-tree type clock tree has been improper, and it has been difficult to design a clock distributing circuit in which the clock skew and the clock propagation delay time are simultaneously and surely optimized.

The present LSI circuit has plural data flow parts, and it is necessary to construct clock trees which are independent of one another every different data flow. As a result, there are plural different types of the clock trees, and the number of clock design operations increases. Accordingly, it is difficult to construct an optimum clock tree used for a logic circuit of an LSI circuit in a short time.

This invention has been implemented in view of the foregoing problem, and has an object to provide a clock distributing method that can easily construct an optimum clock tree.

Furthermore, this invention has another object to provide a clock distributing method for a clock tree with which an estimating LSI circuit containing a BIST circuit can be tested in a short time.

SUMMARY

According to one aspect of the present invention, there is provided an integrated circuit. The integrated circuit includes a test pattern input unit for inputting a test pattern into plural cells, a clock distributing unit for distributing a clock signal to the plural cells, a first cell of the plural cells that receives the clock signal distributed by the clock distributing unit, a second cell of the plural cells that receives the clock signal after the clock signal is received by the first cell, a data transfer unit for transferring a data signal from the first cell to the second cell, a clock transfer unit for distributing the clock signal to the first cell and the second cell and transferring the clock signal in the same direction as the transfer direction of the data signal, and a failure detecting unit for inputting the test pattern into the plural cells from the test pattern input unit on the basis of the clock signal transferred from the clock transfer unit, and detecting failures of the plural cells on the basis of the results of the test pattern output from the plural cells.

According to the clock distributing method of present invention, the following effect and advantage can be attained.

When a clock distributing circuit is designed, a wiring path to arranged blocks is determined while adjusting both the wiring state and the insertion/arrangement state of buffers. Therefore, the clock propagation delay time and the clock skew are optimized simultaneously and surely and thus an optimum clock tree can be easily constructed in a short time.

Furthermore, by using an optimum clock distributing circuit along data flow, an estimating LSI circuit containing a BIST circuit can be tested in a short time.

The above-described embodiments of the present invention are intended as examples, and all embodiments of the present invention are not limited to including the features described above.

DETAILED DESCRIPTION OF THE PREFERRED EMBODIMENTS

Reference may now be made in detail to embodiments of the present invention, examples of which are illustrated in the accompanying drawings, wherein like reference numerals refer to like elements throughout.

Embodiments of the present invention will be hereunder described with reference to the accompanying drawings.

Figure 1:
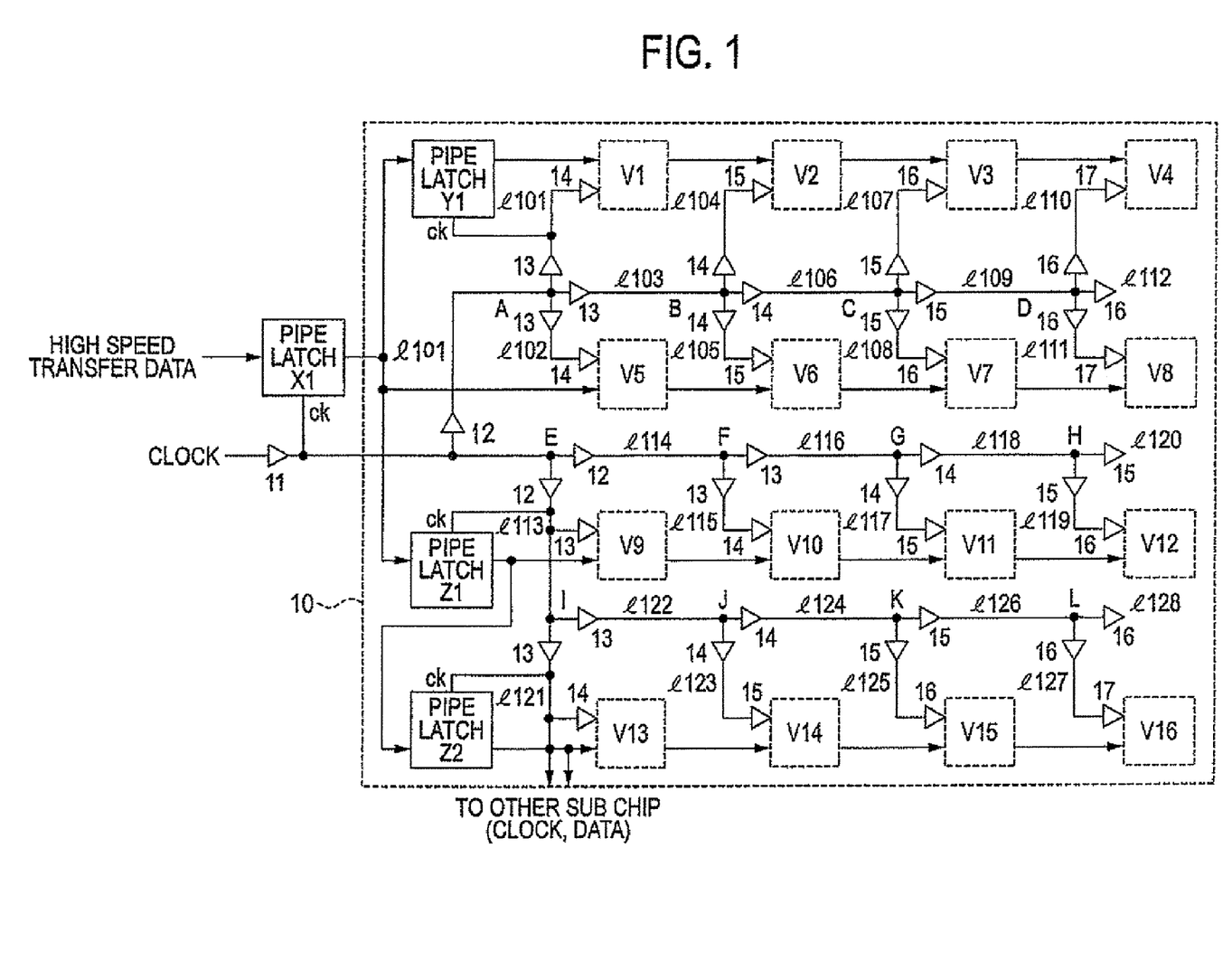
FIG. 1 is a diagram showing the principle of a clock distributing circuit according to the present invention.

FIG. 1 is a diagram showing the principle construction of a clock distributing circuit and clock signal distribution styles according to an embodiment of the present invention. With respect to blocks V1 to V16 of FIG. 1, blocks V1 to V8 at the upper half portion of FIG. 1 and blocks V9 to V16 at the lower half portion of FIG. 1 are subjected to different clock signal distribution styles.

[1] First Embodiment

First embodiment relates to the blocks, or cells, V1 to V8 shown in FIG. 1. The clock distributing circuit of the first embodiment is equipped with the blocks V1 to V8 of plural stages (two stages in FIG. 1) and buffers 11 to 17 for transmitting signals to the blocks V1 to V8. The buffers 11 to 17 are connected to one another through clock wires.

More specifically, a chip 10 of a semiconductor integrated circuit such as an LSI circuit or the like receives high-speed data and a clock signal. The clock signal supplied from the external clock to the buffer 11 is successively distributed to the buffers 12, 13, etc. (l100). The clock signal supplied to a place A is input to buffers 14 through the buffers 13 on the clock wire (l101, l102), which may comprise a clock transfer unit, by the clock wire containing the place A at the center thereof. The clock signals distributed to the buffers 14 are supplied from the buffers 14 to the blocks V1 and V5. At this time, the wire lengths from the place A to the respective buffers 14 are equal to each other, and thus the clock skew at the buffers 14 can be made uniform. The clock signal supplied from the place A through the buffer 13 and a place B (l103) is input to buffers 14 and 15 (l104, £105). The clock signals distributed to the buffers 15 are supplied from the buffers 15 to the blocks V2 and V6. At this time, the wire lengths from the place B to the buffers 15 are equal to each other, and thus the clock skew at the buffers 15 can be made uniform.

The clock signal supplied from the place B through the buffer 14 and a place C on the clock wire (l106) is input to buffers 15 and 16 (l107, l108), and the clock signals distributed to the buffers 16 are supplied from the buffers 16 to the blocks V3 and V7. At this time, the wire lengths from the place C to the buffers 16 are equal to each other, and thus the clock skew at the buffers 16 can be made uniform. The clock signal supplied from the place C through the buffer 15 and a place D on the clock wire (l109) is input to the buffers 16 and 17 (l110, l111). The clock signals distributed to the buffers 17 are supplied from the buffers 17 to the blocks V4 and V8. At this time, the wire lengths from the place D to the buffers 17 are equal to each other, and the clock skew at the buffers 17 can be made uniform.

The clock signal on the clock wire (l112) is supplied to each block by the same method as described above. As described above, according to the estimating LSI circuit containing the BIST circuit for high-speed test, the clock signal is distributed in the same direction by the clock transfer unit as the flow of the high-speed data input from the external circuit, which may comprise a data transfer unit. That is, the estimating LSI circuit transfers the high-speed data in only one direction, and the transfer of the high-speed data is carried out between only the adjacent blocks. Furthermore, the phase of the clock signal is set to be identical between the blocks V1 and V5, between the blocks V2 and V6, between the blocks V3 and V7 and between the blocks V4 and V8.

Furthermore, in this embodiment, the phase of the clock signal of each block is gradually (step-wise) shifted along the data transfer. That is, the phase difference between the clock signals of the blocks V1 and V4 is large, however, no high-speed data is transferred between the blocks V1 and V4. Accordingly, in this embodiment, the clock tree can be constructed in consideration of the phase difference between the clock signals of only the adjacent blocks such as the blocks V1 and V2 between which the high-speed data are transferred.

As described above, according to this invention, when the clock distributing circuit is designed, a wire path to the arranged blocks is determined while adjusting both the wire state and the buffer insertion/arrangement state. Furthermore, the clock tree is determined so as to minimize the adverse effect of the clock skew.

Accordingly, the optimum clock tree used in the estimating LSI circuit can be easily constructed in a short time. Furthermore, by using the optimum clock distributing circuit, the test of the estimating LSI circuit containing the BIST circuit can be executed in a short time.

[2] Second Embodiment

A second embodiment relates to blocks V9 to V16 shown in FIG. 1. The clock distributing circuit of the second embodiment is equipped with the blocks V9 to V16 of plural stages (two stages in FIG. 1), and buffers 11 to 17 for transmitting signals to the blocks V9 to V16. The buffers 11 to 17 are connected to one another through the clock wire.

More specifically, the chip 10 of the semiconductor integrated circuit such as an LSI circuit or the like receives the high-speed data and the clock signal from the external clock. The clock signal supplied from the external clock to the buffer 11 is successively distributed to the buffers 12, 13, etc. The clock signal supplied to a place E is supplied to the block V9 through the buffers 12 and 13 on the clock wire (l113). The clock signal supplied from the place E through the buffer 12 and a place F on the clock wire (l114) is input through the buffer 13 to the buffer 14 (l115). The clock signal distributed to the buffer 14 is supplied from the buffer 14 to the block V10. The clock signal supplied from the place F through the buffer 13 and a place G on the clock wire (l116) is input through the buffer 14 to the buffer 15 (l117). The clock signal distributed to the buffer 15 is supplied from the buffer 15 to the block V11. The clock signal supplied from the place G through the buffer 14 and a place H on the clock wire (l118) is input through the buffer 15 to the buffer 16 (l119). The clock signal distributed to the buffer 16 is supplied from the buffer 16 to the block V12.

The clock signal on the clock wire (l120) is successively supplied to the next block according to the same method as described above. Furthermore, the clock signal supplied to the place E is input to the buffer 14 through the buffer 12, a place I and the buffer 13 on the clock wire (l121). The clock signal distributed to the buffer 14 is supplied from the buffer 14 to the lock V13. The clock signal supplied from the place I through the buffer 13 and a place J on the clock wire (l122) is input to the buffer 15 through the buffer 14 (l123). The clock signal distributed to the buffer 15 is supplied from the buffer 15 to the block V14.

The clock signal supplied from the place J through the buffer 14 and a place K on the clock wire (l124) is input to the buffer 16 through the buffer 15 (l125). The clock signal distributed to the buffer 16 is supplied from the buffer 16 to the block V15.

The clock signal supplied from the place K through the buffer 15 and a place L on the clock wire (l126) is input to the buffer 17 through the buffer 16 (l127). The clock signal distributed to the buffer 17 is supplied from the buffer 17 to the block V16. The clock signal on the clock wire (l128) is successively supplied to the next block according to the same method as described above.

In the second embodiment, the clock signal is supplied independently to each of the group of the blocks V9 to V12 and the group of the blocks V13 to V16. As described above, in the estimating LSI circuit containing the BIST circuit for high-speed test, the clock signal is distributed in the same direction as the high-speed data input from the external circuit. That is, the estimating LSI circuit transfers the high-speed data in only one direction, and the transfer of the high-speed data is carried out between only the adjacent blocks.

In this embodiment, the phase of the clock signal of each block is gradually (step-wise) shifted along the transfer of the data. That is, the phase difference between the clock signals of the blocks V9 and V12 is larger, however, no high-speed data is transferred between the blocks V9 and V12. Accordingly, according to this embodiment, the clock tree may be constructed in consideration of the phase difference between the clock signals of only the adjacent blocks like the blocks V9 and V10 between which the high-speed data is transferred.

As described above, according to this embodiment, when the clock distributing circuit is designed, the wire path to the respective arranged blocks is determined while adjusting both the wire state and the buffer insertion/arrangement state. Furthermore, the clock tree is determined so as to minimize the adverse effect of the clock skew. Accordingly, the optimum clock tree used in the estimating LSI circuit can be easily constructed in a short time. Furthermore, the test of the estimating LSI circuit containing the BIST circuit can be executed in a short time by using the optimum clock distributing circuit.

Figure 2:
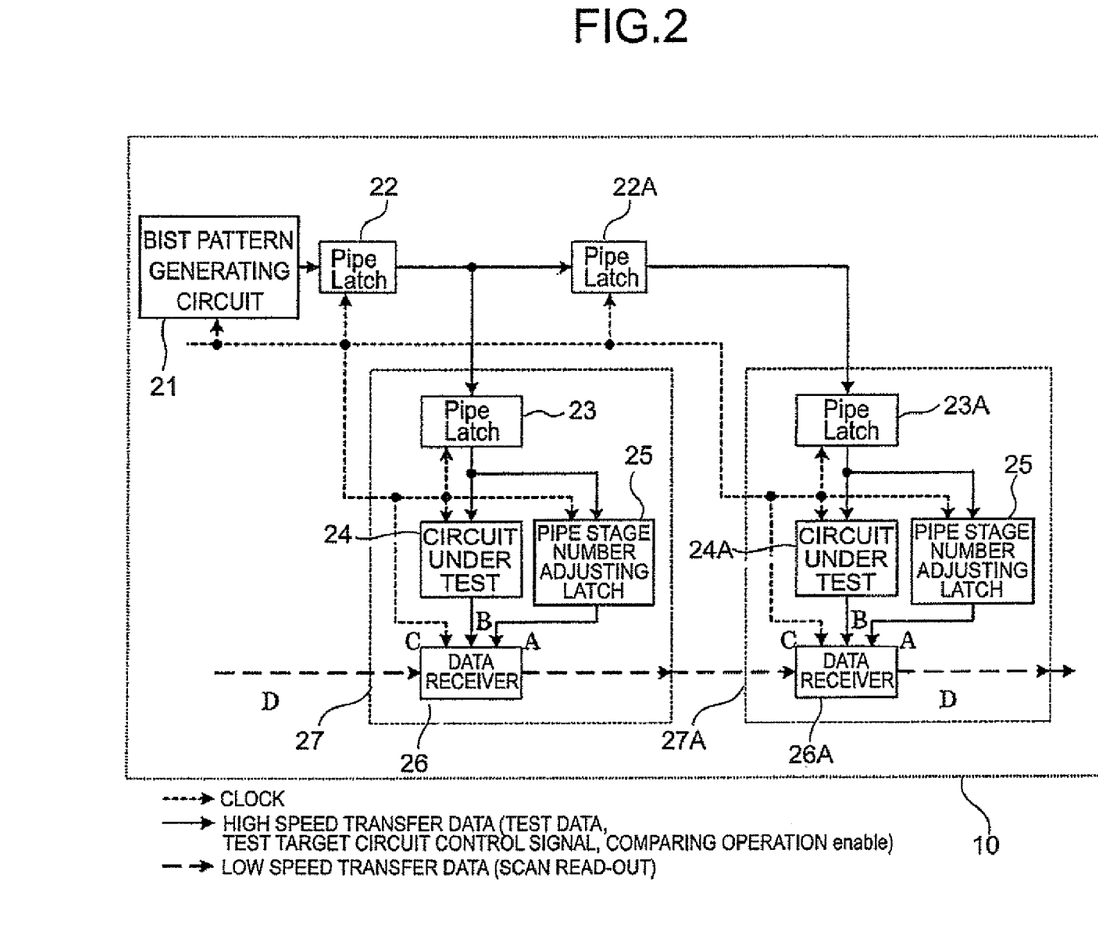
FIG. 2 is a block diagram showing the principle construction.

FIG. 2 is a block diagram showing an embodiment of the invention. FIG. 2 shows an example of the chip 10 containing two blocks 27 and 27A. As shown in FIG. 2, the basic construction of this embodiment contains a BIST pattern generating circuit 21, latches (referred to as "Pipe Latch" in the figures) 22, 22A, 23 and 23A, circuits under test (hereinafter referred to as test target circuits) 24 and 24A, pipe stage number adjusting latches 25 an 25A, data receivers 26 and 26A and the blocks 27 and 27A. The blocks 27 and 27A in FIG. 2 correspond the blocks V1 to V16 in FIG. 1. The BIST pattern generating circuit 21 automatically generates a test pattern for testing the test target circuits and an expected value output every bit.

According to this embodiment, the BIST pattern generating circuit 21 generates test data and a test target circuit control signal as the test pattern for testing the test target circuit 24. The latches 22, 22A, 23 and 23A holds input data therein and outputs the data concerned at the same time when the clock signal is input thereto. The test target circuit 24 receives the test data generated in the BIST pattern generating circuit and the test target circuit control signal. The test target circuit 24 outputs a test result as a test target circuit output value B. The pipe stage number adjusting latch 25 adjusts the pipe latch stage number so that the latch stage number is equal to that of the test target circuit 24. The expected value generated in the BIST pattern generating circuit 21 is adjusted in the pipe stage number adjusting latch 25, and then the adjusted expected value A is output from the pipe stage number adjusting latch 25. A comparison operation enable C and low-speed transfer data D will be described later with reference to FIG. 4.

The circuit operation of FIG. 2 will be described. The BIST pattern generating circuit 21 automatically generates a test data pattern, and inputs the test data pattern to the test target circuits 24 and 24A and the pipe stage number adjusting latches 25 and 25A in the blocks 27 and 27A together with the expected value output every bit. The data receivers 26 and 26A in the blocks 27 and 27A compare the expected value A with a test target circuit control output value B.

Figure 3:
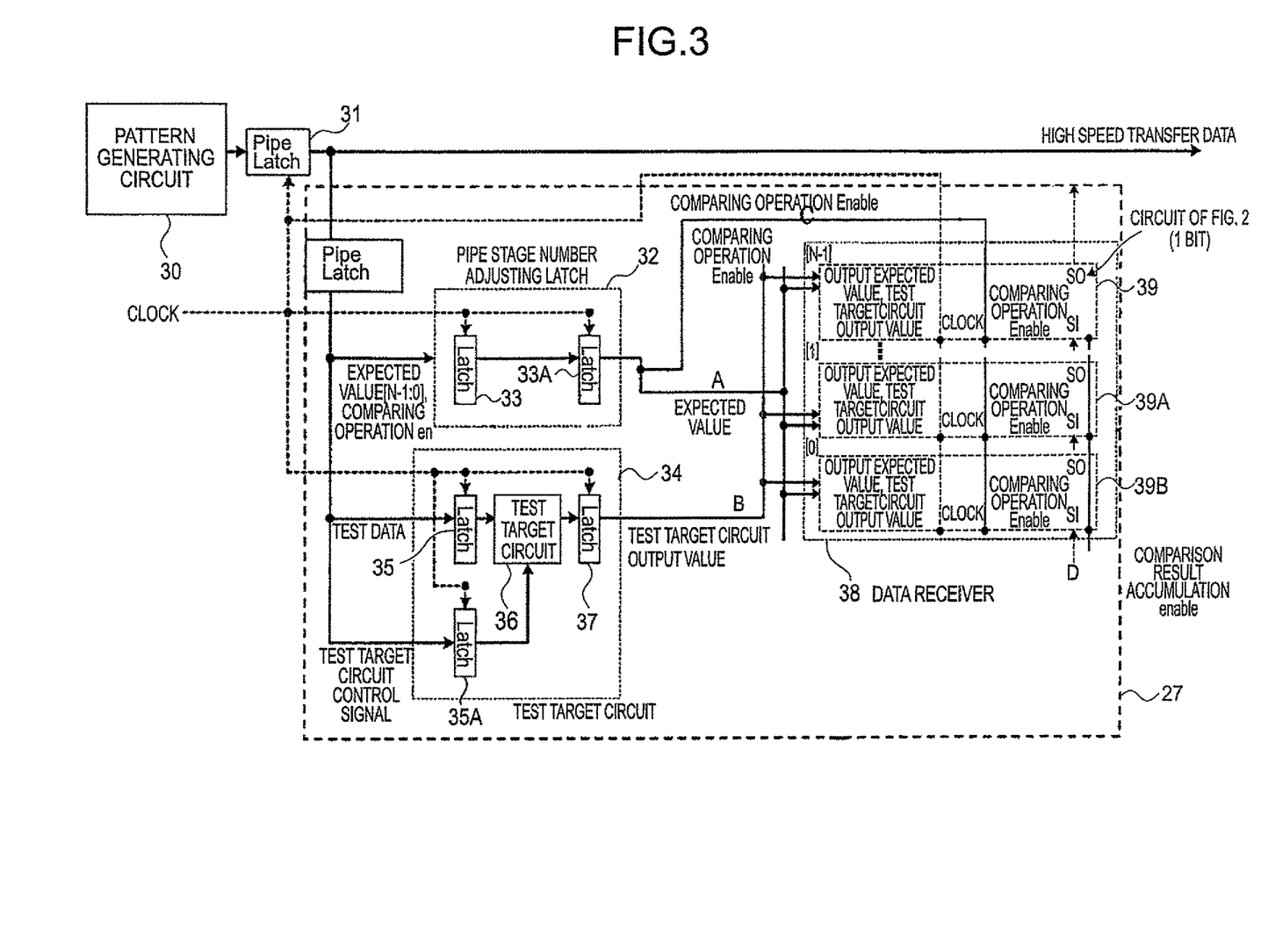
FIG. 3 is a diagram showing the operation of blocks.

FIG. 3 is a diagram showing the operation of the blocks an embodiment of this invention. In FIG. 3, the blocks 27 and 27A shown in FIG. 2 will be further described. The pattern generating circuit 30 generates test data and a test target circuit control signal as a test data pattern. The thus-generated test data and test target circuit control signal are input to the test target circuit 34 in the block 27.

At the same time, the pattern generating circuit 30 generates an expected value, and inputs to the pipe latch 31. The expected value output from the pipe latch is input to the pipe stage number adjusting latch 32 in the block 27. At the same time when the clock signal is input, the latches (LATCH) 33, 33A, 35, 35A, 37 holds the input data in the latches and output the data concerned.

The expected value A output from a pipe stage number adjusting latch 32 is input to a data receiver 38. Furthermore, a test target circuit output value B output from the test target circuit in the test target circuit 34 is also input to the data receiver 38.

In this embodiment, the data receiver 38 compares the expected value A with the test target circuit output value B at high speed. The data receiver 38 reads out the comparison result of the high-speed test at low speed by a scan mechanism D. Accordingly, the chip 10 of the semiconductor integrated circuit such as LSI circuit or the like according to the present embodiment can judge the existence of a failure.

Figure 4:
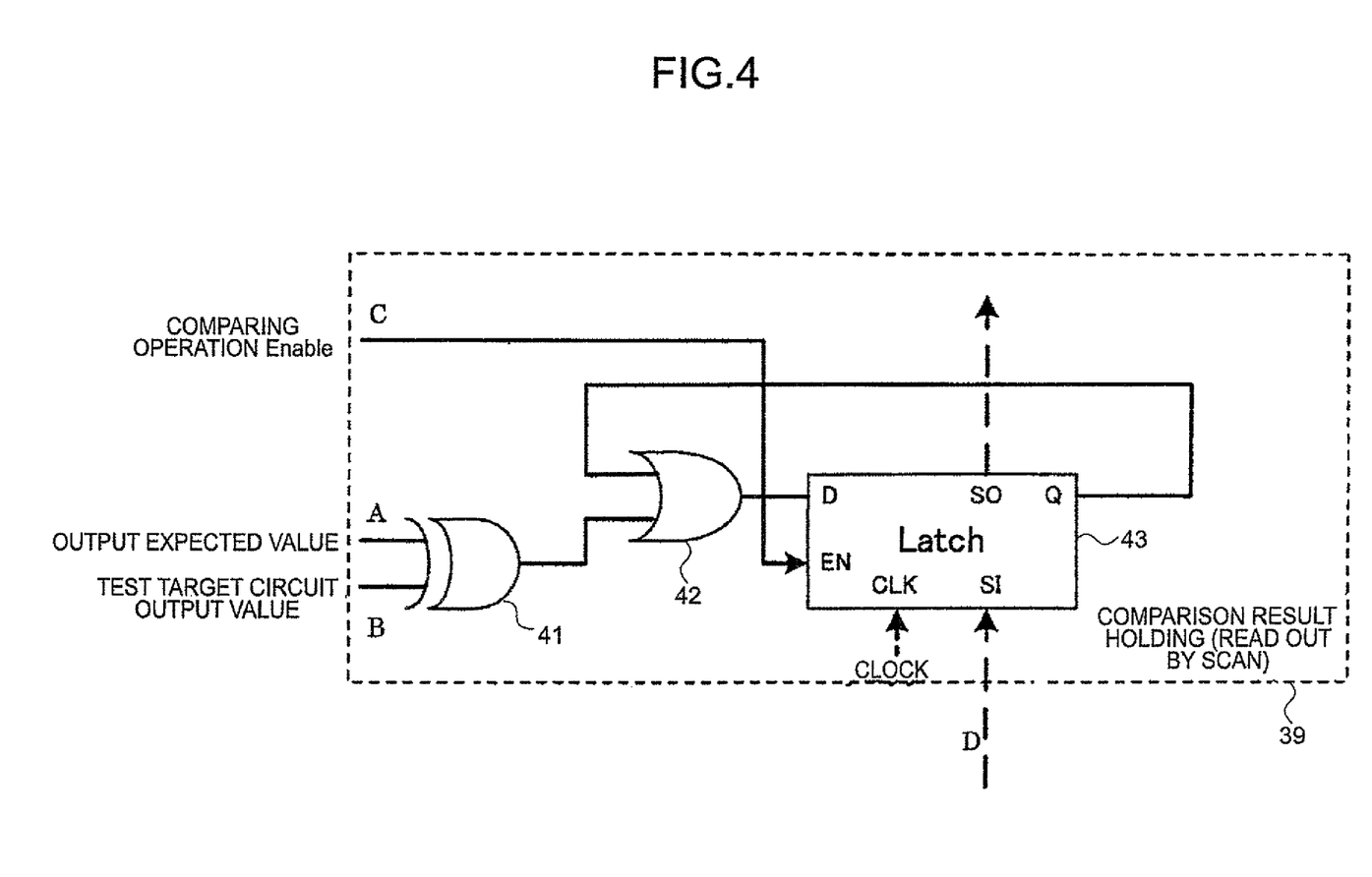
FIG. 4 is a diagram showing the operation of a data receiver.

The detailed operation of the data receiver 38 will be described later with reference to FIG. 4. The data receiver 38 comprises an assemble of plural circuits 39, 30A, 39B each of which is used for one bit as shown in FIG. 4. FIG. 4 is a diagram showing the operation of the data receiver of this embodiment.

As shown in FIG. 4, the data receiver 39 comprises an XOR operation circuit 41, an OR operation circuit 42 and a latch 43. The XOR (Exclusive OR) operation circuit 41 is called an exclusive logical addition circuit, and it carries out such an operation that if the number of inputs of "true" (or 1) is odd, the output thereof becomes true (or 1) and if it is even, the output thereof becomes false (or 0).

When there are two inputs of the output expected value A and the test target circuit output value B as in the case of this embodiment, if any one of the inputs is true (or 1), the output is true (or 1). If both the inputs are true (or 1) and both the inputs are false (or 0), the output is false (or 0). The OR operation circuit 42 is called a logical addition circuit, and it carries out such an operation that if at least one input is true (or 1), the output thereof is true (or 1) and if all the inputs are false (or 0), the output thereof false (or 0).

In an embodiment of the invention, the output of a latch 43 and the output of the XOR operation circuit 41 are input to the OR operation circuit 42. The output of the OR operation circuit 42 is input to the D input terminal of the latch 43, and a signal C for enabling the comparison operation from the BIST circuit is input to an EN input terminal. The scan readout signal D is input to the SI (Scan-In) terminal of the latch 43 (if there is a data receiver at the previous stage, the output thereof is input), and output from the SO (Scan-Out) terminal (if there is a data receiver at the rear stage, the output is input to the input terminal thereof). The latch 43 is controlled in accordance with the signal input to the clock terminal (CLK).

That is, when the signal is input to the clock terminal (CLK), the latch 43 which is set to an ON state takes in data of the input terminal (D) thereof, and outputs the take-in data to the output terminal (Q) thereof. When no signal is input to the clock terminal (CLK), the latch 43 is set to an OFF state, and thus no data is taken into the input terminal (D) thereof, and the latch 43 holds the previous data output. Accordingly, the output of the data of the latch (D-LATCH is used in this embodiment) is varied only when the clock signal is input.

The operation of the data receiver 39 will be described hereunder.

The XOR (Exclusive OR) operation circuit 41 receives the output expected value A output from the pipe stage number adjusting latch 32 and the test target circuit output value B output from the test target circuit 34. When both the output expected value A and the test target circuit output value B are equal to 1 or 0, the comparison result is regarded as being good, and thus output is set to 0. On the other hand, when any one of the output expected value A and the test target circuit output value B is equal to 1, the comparison result is regarded as being bad, and thus the output is set to 1.

When both the output expected value A and the test target circuit output value B are equal to each other, the XOR operation circuit 41 sets the operation result to zero, and inputs the operation result to the OR operation circuit 42. When the signal C for enabling the comparison operation is input from the BIST circuit to the EN input terminal, the latch 43 takes in data at the timing at which the signal is input to the clock terminal (CLK). When 0 is input from the OR operation circuit 42 into the input terminal (D) the latch 43, 0 is output from the output terminal (Q). The data (0) output from the output terminal (Q) is input to the OR operation circuit 42.

On the other hand, the OR operation circuit 42 executes the logical operation on two inputs of 0 output from the latch and the data output from the XOR operation circuit 41. When both the output expected value A and the test target circuit output value B are equal to each other, the OR operation circuit 42 executes the logical operation on two inputs of 0 output from the latch and 0 output from the XOR operation circuit 41. Since all the inputs are equal to zero, the output of the OR operation circuit 42 is equal to 0.

However, when the output expected value A and the test target circuit output value B are different from each other, the OR operation circuit 42 executes the logical operation on two inputs of 0 output from the latch and 1 output from the XOR operation circuit 41, and thus the OR operation circuit 42 outputs 1. When 1 is input to the input terminal (D) of the latch 43 from the OR operation circuit 42 at the timing at which the signal is input to the clock terminal (CLK), 1 is output from the output terminal (Q). The data (1) output from the output terminal (Q) is input to the OR operation circuit 42. The OR operation circuit 42 outputs 1 when one or more inputs are equal to 1.

Through the above operation, when the output expected value A and the test target circuit output value B are once different from each other, 1 is input to the input terminal (D) at the timing when the signal is input to the clock terminal (CLK), and 1 is output from the output terminal (Q). The scan read-out signal D scans from the SI terminal to the SO terminal of the latch 43 to read out the data of 1 which indicates that the output expected value A and the test target circuit output value B are different from each other. Accordingly, the chip 10 of the semiconductor integrated circuit such as an LSI circuit or the like according to the present embodiment can judge the existence of a failure by the data receiver 39.

Figure 5:
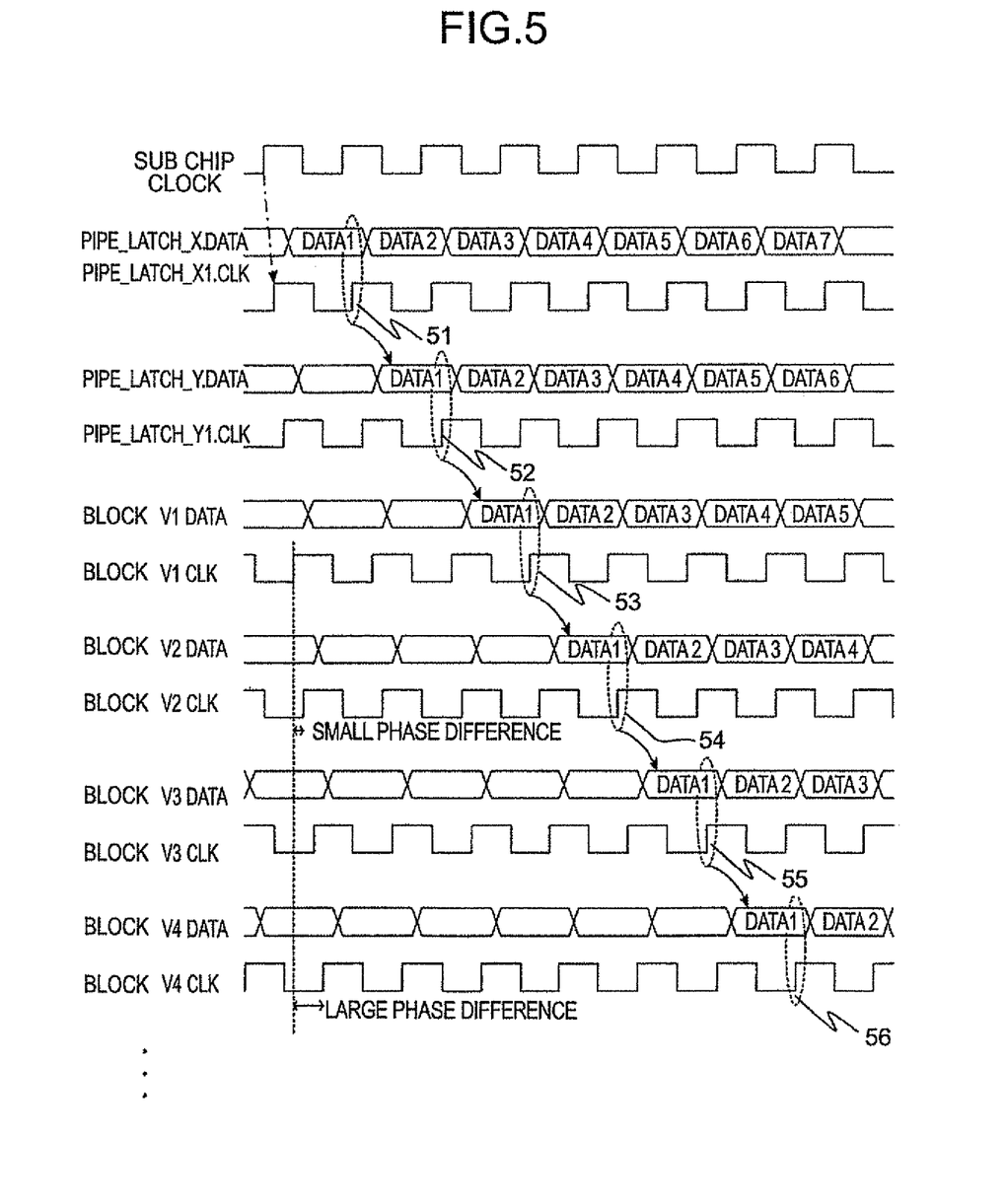
FIG. 5 is a delay chart of a clock distributing circuit.

FIG. 5 is a delay chart of the clock distributing circuit. As in the case of the related art shown in FIG. 7, it has been hitherto general that the clocks of the respective blocks have the same phase. However, according to the present embodiment, as shown in FIG. 5, the clock phases 51 to 56 of the respective blocks are step-wise shifted along the flow of the data.

As shown in FIG. 1, the clock signal is distributed to the respective blocks V1 to V8 in the chip 10 or the blocks V9 to V16 in the chip 10 through the buffers 11 to 17 at the plural stages. As is apparent from FIG. 5, the clock phases 51, 52 of the pipe latches (Pipe_Latch) X1, Y1 and the clock phases 53, 54, 55, 56, . . . of the respective blocks V1 to V8 (V9 to V16) are shifted in conformity with the data 1.

In the estimating LSI circuit as shown in the present embodiment, the high-speed data are transferred in only one direction, and the transfer of the high-speed data is carried out between only the adjacent blocks. Furthermore, the phase difference between the clock signals of the blocks V1 to V4 is large, however no high-speed data is transferred between the blocks V1 and V4. Accordingly, with respect to the difference in clock phase, attention may be paid to only the phases of the clock signals of the adjacent blocks such as the blocks V1 and V2, etc.

Accordingly, it is unnecessary to make the phases of the respective blocks completely coincident with one another as in the case of the related art. Accordingly, when the clock distributing circuit is designed, the wire path to the respective arranged blocks is determined while both the wire arrangement and the buffer insertion/arrangement state are adjusted. Furthermore, the clock tree is determined so that the adverse effect of the clock skew is minimized, and further the degree of design freedom of the clock tree can be enhanced. Accordingly, the clock tree which is optimally used in the estimating LSI circuit can be easily constructed in a short time. Still furthermore, by using the optimum clock distributing circuit, the test of the estimating LSI circuit containing the BIST circuit can be executed in a short time.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An integrated circuit comprising:
    a test pattern input unit for inputting a test pattern into plural cells;
    a clock distributing unit for distributing a clock signal to the plural cells;
    a first cell of the plural cells that receives the clock signal distributed by the clock distributing unit;
    a second cell of the plural cells that receives the clock signal after the clock signal is received by the first cell;
    a data transfer unit for transferring a data signal from the first cell to the second cell;
    a clock transfer unit for distributing the clock signal to the first cell and the second cell and transferring the clock signal from the first cell to the second cell; and
    a failure detecting unit for inputting the test pattern into the plural cells from the test pattern input unit on the basis of the clock signal transferred from the clock transfer unit, and detecting failures of the plural cells on the basis of the results of the test pattern output from the plural cells.

2. The integrated circuit according to claim 1, wherein the data transfer unit successively transfers the data signal to the plural cells subsequent to the first cell and the second cell, and the clock transfer unit successively transfers the clock signal from the first cell to the second cell.

3. An information processing device having an integrated circuit comprising:
    a test pattern input unit for inputting a test pattern into plural cells;

a clock distributing unit for distributing a clock signal to the plural cells;

a first cell of the plural cells that receives the clock signal distributed by the clock distributing unit;

a second cell of the plural cells that receives the clock signal after the clock signal is received by the first cell;

a data transfer unit for transferring a data signal from the first cell to the second cell;

a clock transfer unit for distributing the clock signal to the first cell and the second cell and transferring the clock signal from the first cell to the second cell; and a failure detecting unit for inputting the test pattern into the plural cells from the test pattern input unit on the basis of the clock signal transferred from the clock transfer unit, and detecting failures of the plural cells on the basis of the results of the test pattern output from the plural cells.

4. The information processing device according to claim 3, wherein the data transfer unit successively transfers the data signal to the plural cells subsequent to the first cell and the second cell, and the clock transfer unit successively transfers the clock signal from the first cell to the second cell.

5. A test method for an information processing device including plural cells, a first cell of the plural cells that receives a clock signal, and a second cell of the plural cells that receives the clock signal after the first cell receives the clock signal, a test pattern being input to the plural cells, comprising:

inputting the test pattern into the plural cells;

transferring a data signal from the first cell to the second cell;

distributing the clock signal to the first cell and the second cell and transferring the clock signal from the first cell to the second cell; and inputting the test pattern to the plural cells on the basis of the transferred clock signal, and detecting failures of the plural cells on the basis of the results of the test pattern output from the plural cells.

* * * * *